US012564018B2

(12) United States Patent
Kim et al.

(10) Patent No.:  US 12,564,018 B2
(45) Date of Patent:      Feb. 24, 2026

(54) OPERATING METHOD OF ELECTRONIC DEVICE CONFIGURED TO SUPPORT MANUFACTURING SEMICONDUCTOR DEVICE, AND OPERATING METHOD OF SEMICONDUCTOR MANUFACTURING SYSTEM INCLUDING ELECTRONIC DEVICES CONFIGURED TO SUPPORT MANUFACTURING SEMICONDUCTOR DIES

(71) Applicant: Samsung Electronics Co., Ltd., Suwon-si (KR)

(72) Inventors: Kihun Kim, Suwon-si (KR); Yongju Jeon, Suwon-si (KR); Kwang Soo Kim, Suwon-si (KR); Jhongkwon Kim, Suwon-si (KR); Jang Ryul Park, Suwon-si (KR); Byeong Kyu Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/897,029

(22) Filed: Sep. 26, 2024

(65) Prior Publication Data

US 2025/0259900 A1      Aug. 14, 2025

(30) Foreign Application Priority Data

Feb. 14, 2024   (KR) ........................ 10-2024-0020729

(51) Int. Cl.
H01L 21/66        (2006.01)
G01N 21/88        (2006.01)
(Continued)

(52) U.S. Cl.
CPC ......... H01L 22/24 (2013.01); G01N 21/8806 (2013.01); G01N 21/9501 (2013.01);
(Continued)

(58) Field of Classification Search
CPC ......... H01L 22/24; H01L 22/12; H01L 22/20; G01N 21/8806; G01N 21/9501;
(Continued)

(56) References Cited

U.S. PATENT DOCUMENTS 5,479,252 A * 12/1995 Worster .............. G01R 31/311
356/369
9,829,441 B2  11/2017 Park et al.
(Continued)

FOREIGN PATENT DOCUMENTS

JP        5132277 B2    11/2012
JP        7282853 B2    5/2023
(Continued)

*Primary Examiner* — Michael E Teitelbaum
(74) *Attorney, Agent, or Firm* — Wolf, Greenfield & Sacks, P.C.

(57) ABSTRACT

A method of operating an electronic device that is configured to support manufacturing a semiconductor device includes (i) selecting a height of a stage of the electronic device that is configured to hold the semiconductor device, (ii) generating white light by using a light source of the electronic device, (iii) generating light of a selected wavelength by filtering the white light using a monochromater of the electronic device, (iv) emitting the light of the selected wavelength to the semiconductor device using a beam splitter of the electronic device, and (v) capturing reflection light reflected from the semiconductor device using a camera of the electronic device.

20 Claims, 14 Drawing Sheets

(51) Int. Cl.

| | |
|---|---|
| *G01N 21/95* | (2006.01) |
| *G06F 30/392* | (2020.01) |
| *G06T 7/00* | (2017.01) |

(52) U.S. Cl.
CPC ............ *G06F 30/392* (2020.01); *G06T 7/001* (2013.01); *H01L 22/12* (2013.01); *G01N 2201/025* (2013.01); *G06T 2207/10152* (2013.01); *G06T 2207/30148* (2013.01)

(58) Field of Classification Search
CPC ......... G01N 2201/025; G01N 21/8851; G01N 21/956; G01N 2021/8845; G01N 2021/8864; G06F 30/392; G06T 7/001; G06T 2207/10152; G06T 2207/30148
See application file for complete search history.

(56) References Cited

U.S. PATENT DOCUMENTS

| | | | |
|---|---|---|---|
| 11,067,389 B2 | 7/2021 | Chuang et al. | |
| 11,781,996 B1 | 10/2023 | Kang et al. | |
| 11,852,590 B1 | 12/2023 | Manassen et al. | |
| 2017/0301079 A1 | 10/2017 | Cho et al. | |
| 2018/0144995 A1* | 5/2018 | Kim ................... | G01B 11/022 |
| 2021/0104034 A1* | 4/2021 | Wu ..................... | G06T 7/0006 |
| 2021/0396510 A1 | 12/2021 | Kim et al. | |
| 2024/0296545 A1* | 9/2024 | Song ................... | G06V 10/74 |

FOREIGN PATENT DOCUMENTS

| | | |
|---|---|---|
| KR | 20070074987 A | 7/2007 |
| KR | 20190128090 A | 11/2019 |
| KR | 20210156894 A | 12/2021 |
| KR | 102526522 B1 | 4/2023 |
| KR | 102554833 B1 | 7/2023 |

* cited by examiner

OPERATING METHOD OF ELECTRONIC DEVICE CONFIGURED TO SUPPORT MANUFACTURING SEMICONDUCTOR DEVICE, AND OPERATING METHOD OF SEMICONDUCTOR MANUFACTURING SYSTEM INCLUDING ELECTRONIC DEVICES CONFIGURED TO SUPPORT MANUFACTURING SEMICONDUCTOR DIES

CROSS-REFERENCE TO RELATED APPLICATIONS

This application claims priority under 35 U.S.C. § 119 to Korean Patent Application No. 10-2024-0020729 filed on Feb. 14, 2024, in the Korean Intellectual Property Office, the disclosures of which are incorporated by reference herein in their entireties.

Embodiments of the present disclosure described herein relate to an electronic device, and more particularly, relate to an operating method of an electronic device configured to detect a defect or weak area statistically and to support manufacturing a semiconductor device, and an operating method of a semiconductor manufacturing system including electronic devices configured to support manufacturing a plurality of semiconductor dies on a wafer.

BACKGROUND

A semiconductor device may be manufactured through various processes. With the development of semiconductor device design technologies, the number of processes for manufacturing a semiconductor device is increasing, and the complexity of each process is increasing. As the number of processes and the complexity of the semiconductor device increase, various defects may occur in the process of manufacturing a semiconductor device.

For example, when a specific pattern is formed, skew may occur, where the specific pattern is located or positioned differently than the designed or intended location. Due to skew, patterns intended to be connected to each other may be separated from each other, or patterns intended to be separated from each other may be connected to each other. Accordingly, skew may result in defective semiconductor devices.

SUMMARY

Embodiments of the present disclosure provide a method of operating an electronic device configured to detect a structural defect or weak area of a semiconductor device statistically by using data measured from the semiconductor device itself (without a structural modeling of the semiconductor device) and to support manufacturing a semiconductor device, and a method of operating a semiconductor manufacturing system including electronic devices configured to support manufacturing a plurality of semiconductor dies on a wafer.

According to an embodiment, a method of operating an electronic device that is configured to support manufacturing a semiconductor device includes selecting a height of a stage of the electronic device using an actuator of the electronic device, wherein the stage holds the semiconductor device, generating white light of a first wavelength range using a light source of the electronic device, generating light of a selected wavelength within the first wavelength range by filtering the white light using a monochromater of the electronic device, emitting the light of the selected wavelength to the semiconductor device using a beam splitter of the electronic device, capturing reflection light reflected from the semiconductor device using a camera of the electronic device, adjusting the selected wavelength and repeating, at the electronic device, the generating of the light of the selected wavelength, the emitting, and the capturing responsive to the adjusting the selected wavelength, and adjusting the height of the stage and repeating, at the electronic device, the generating of the white light, the generating of the light of the selected wavelength, the emitting, the capturing, and the repeating responsive to the adjusting of the height of the stage.

According to an embodiment, a method of operating an electronic device that is configured to support manufacturing a plurality of semiconductor dies includes receiving, at the electronic device, first images captured from reference semiconductor dies among the plurality of semiconductor dies, receiving, at the electronic device, second images captured from remaining semiconductor dies among the plurality of semiconductor dies, and detecting, at the electronic device, weak areas of at least one of the plurality of semiconductor dies based on the first images and the second images. The second images include data indicating a height of the remaining semiconductor dies, a wavelength of a light emitted to the remaining semiconductor dies, a column of pixels of each of the second images, and a row of the pixels.

According to an embodiment, a method of operating a semiconductor manufacturing system which includes first and second electronic devices configured to support manufacturing a plurality of semiconductor dies on a wafer includes selecting a height of a stage of the first electronic device, wherein the stage is configured to hold the wafer, generating white light of a first wavelength range using a light source of the first electronic device, generating light of a selected wavelength within the first wavelength range by filtering the white light using a monochromater of the first electronic device, emitting the light of the selected wavelength to the plurality of semiconductor dies using a beam splitter of the first electronic device, capturing reflection light reflected from the plurality of semiconductor dies using a camera of the first electronic device, adjusting the selected wavelength and repeating, at the first electronic device, the generating of the light of the selected wavelength, the emitting, and the capturing responsive to the adjusting the selected wavelength, adjusting the height of the stage and repeating, at the first electronic device, the generating of the white light, the generating of the light of the selected wavelength, the emitting, the capturing, and the repeating responsive to the adjusting the height of the stage, selecting a next one the plurality of semiconductor dies and repeating, at the first electronic device, the selecting, the generating of the white light, the generating of the light of the selected wavelength, the emitting, the capturing, the adjusting the selected wavelength, and the adjusting the height of the stage, responsive to the selecting a next one the plurality of semiconductor dies, receiving, at the second electronic device, first images captured from reference semiconductor dies among the plurality of semiconductor dies, receiving, at the second electronic device, second images captured from remaining semiconductor dies among the plurality of semiconductor dies, and detecting, at the second electronic device, weak areas of at least one of the plurality of semiconductor dies based on the first images and the second images. The second images include data indicating a height of the remaining semiconductor dies, a wavelength of the light emitted to the remaining semiconductor dies, a column of pixels of each of the second images, and \a row of the pixels.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily carries out the present disclosure.

Figure 1:
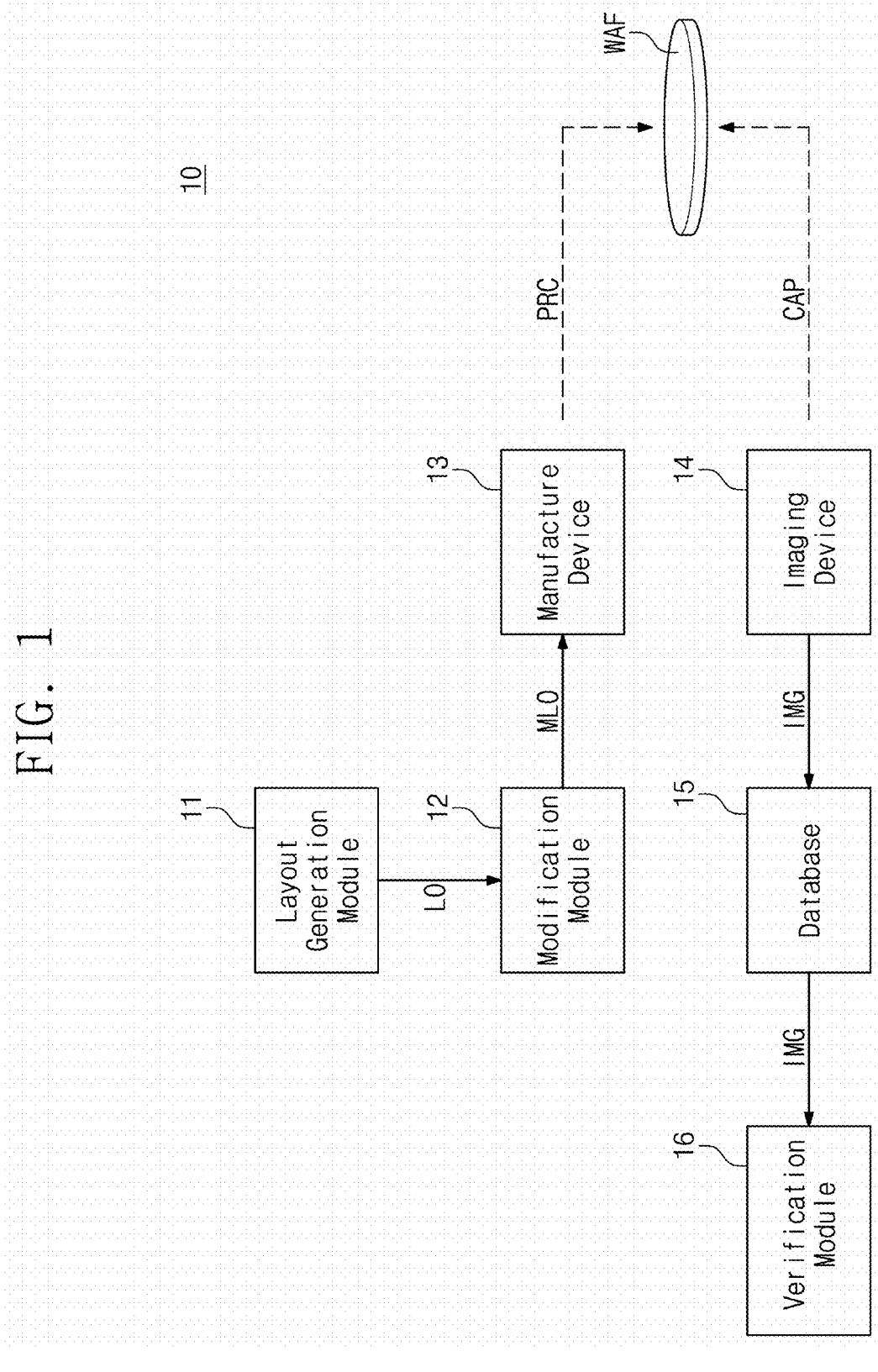
FIG. 1 illustrates a semiconductor manufacturing system according to an embodiment of the present disclosure.

FIG. 1 illustrates a semiconductor manufacturing system 10 according to an embodiment of the present disclosure. Referring to FIG. 1, the semiconductor manufacturing system 10 may include a layout generation module 11, a modification module 12, a manufacture device 13, an imaging device 14, a database 15, and a verification module 16. The semiconductor manufacturing system 10 may manufacture semiconductor devices from or by using a wafer WAF.

The layout generation module 11 may generate a layout image LO. For example, the layout generation module 11 may generate or receive circuit-based design information. The layout generation module 11 may generate the layout image LO by placing standard cells based on the design information. Alternatively, after placing the standard cells, the layout generation module 11 may generate the layout image LO by modifying the standard cells or placing specialization cells, which are not included in the standard cells, under control of the user. For example, the layout image LO which the layout generation module 11 generates may be a design image for manufacturing semiconductor devices and may include patterns to be formed in a semiconductor device or shapes of edges of the patterns.

The modification module 12 may receive the layout image LO for manufacturing semiconductor devices from the layout generation module 11. In an embodiment, the modification module 12 may generate a modified layout image MLO from the layout image LO. For example, the modification module 12 may generate the modified layout image MLO from the layout image LO under control of the user, based on a given algorithm, or based on a machine learning (or deep learning) module trained in advance.

The modification module 12 may generate the modified layout image MLO from the layout image LO based on various factors capable of being caused in the process of manufacturing semiconductor devices. For example, the modification module 12 may generate the modified layout image MLO based at least on a process proximity correction (PPC) and an optical proximity correction (OPC).

The process proximity correction may be used to correct distortions caused during processes (e.g., an etching process) due to various factors including characteristics of materials for performing a process, characteristics of materials to which the process is applied, characteristics of photoresist patterns, etc. The optical proximity correction may be performed to correct distortions caused in photoresist patterns due to various factors, which include a characteristic of a light source, a characteristic of a photoresist, positional relationships between the light source and patterns formed in the photoresist, etc., in the process of generating a photomask for the manufacture of semiconductor devices.

The manufacture device 13 may receive the modified layout image MLO from the modification module 12. The manufacture device 13 may apply processes PRC to the wafer WAF based on the modified layout image MLO. For example, the processes PRC may include an etching process, a deposition process, a growth process, a planarization process, etc. As the processes PRC are applied to the wafer WAF, semiconductor devices may be formed in the wafer WAF in the shape of semiconductor dies.

The imaging device 14 may generate a captured image IMG by capturing an image of the semiconductor devices formed in the wafer WAF (refer to "CAP" of FIG. 1). For example, the imaging device 14 may include various imaging devices such as a spectral through-focus scanning optical microscope (TSOM), a TSOM, and a scanning electron microscope (SEM).

The database 15 may receive the captured image IMG of the semiconductor devices manufactured based on the layout image LO, from the imaging device 14. The database 15 may store the captured image IMG.

The verification module 16 may receive the captured images IMG from the database 15. The verification module 16 may detect defect or weak areas of the semiconductor devices manufactured on the wafer WAF in the shape of semiconductor dies, based on the captured images IMG. For example, the verification module 16 may detect defect or weak locations by processing the captured images IMG statistically.

In an embodiment, the layout generation module 11, the modification module 12, and the verification module 16 may be implemented with software, a processor designed or configured to perform a relevant function, or any combination of hardware and software designed to perform a relevant function. The software may include computer program instructions may also be stored in a non-transitory computer usable or computer-readable memory.

Figure 2:
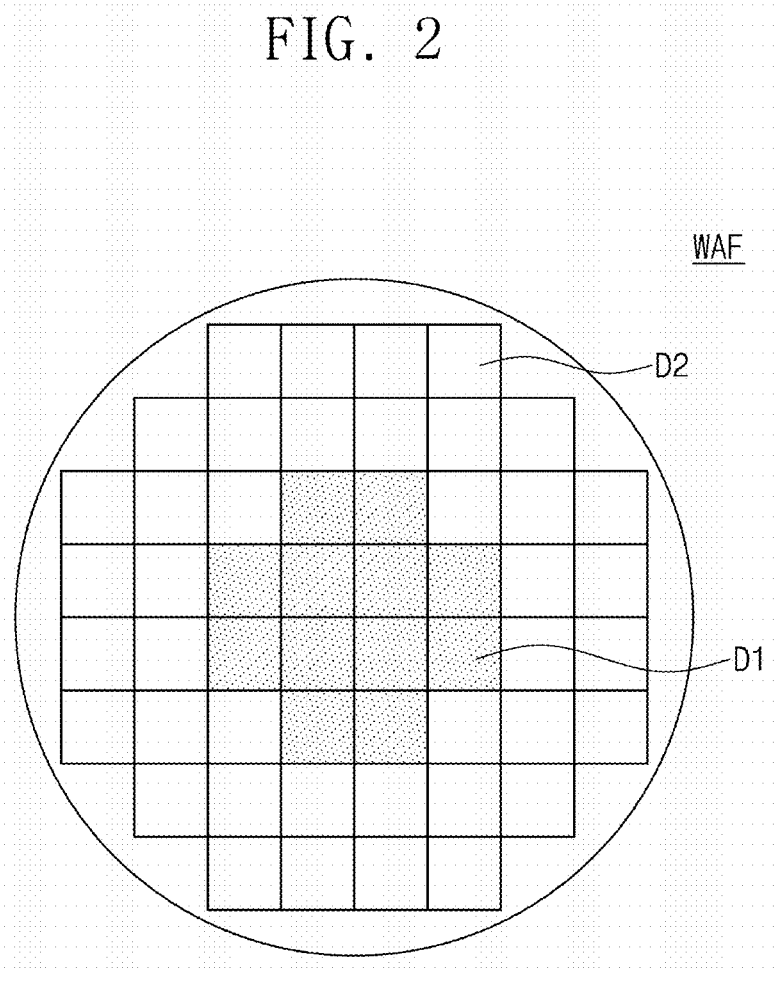
FIG. 2 illustrates an example of semiconductor devices manufactured on a wafer to be singulated into or in the shape of semiconductor dies by a semiconductor manufacturing system.

FIG. 2 illustrates an example of semiconductor devices manufactured on the wafer WAF in the shape of semiconductor dies by the semiconductor manufacturing system 10. Referring to FIGS. 1 and 2, semiconductor dies may be manufactured on the wafer WAF in the shape of a quadrangle. In an embodiment, semiconductor dies close to the center of the wafer WAF may be first semiconductor dies D1. The remaining semiconductor dies positioned outside (or surrounding) the first semiconductor dies D1 may be second semiconductor dies D2. The term "surround" may not require completely surrounding the described elements, but may, for example, refer to partially surrounding the described elements.

In an embodiment, the influence or results of the processes PRC for manufacturing the semiconductor dies may differently appear in a central area and a peripheral area of the wafer WAF. For example, in the central area of the wafer WAF, the processes PRC may apply an intended result with a relatively small margin of error to the wafer WAF. In the peripheral area of the wafer WAF, the processes PRC may apply an intended result with a relatively large margin of error to the wafer WAF.

The first semiconductor dies D1 positioned in the central area of the wafer WAF may be regarded as normal or reference semiconductor dies with a relatively small process error. The second semiconductor dies D2 (e.g., the remaining semiconductor dies) surrounding (or positioned outside) the first semiconductor dies D1 may be regarded as having a relatively large process error. The second semiconductor dies D2 may be regarded as defective semiconductor dies.

The verification module 16 according to an embodiment of the present disclosure may calculate (or extract) statistical characteristics of normal semiconductor dies from the first semiconductor dies D1 regarded as normal or reference semiconductor dies. The verification module 16 may detect a defect or weak area (e.g., a weak area) regarded as having a defect by comparing (or verifying) statistical characteristics of the second semiconductor dies D2 regarded as having a defect (or between up to all the semiconductor dies including the first semiconductor dies D1 and the second semiconductor dies D2) and the first semiconductor dies D1.

Figure 3:
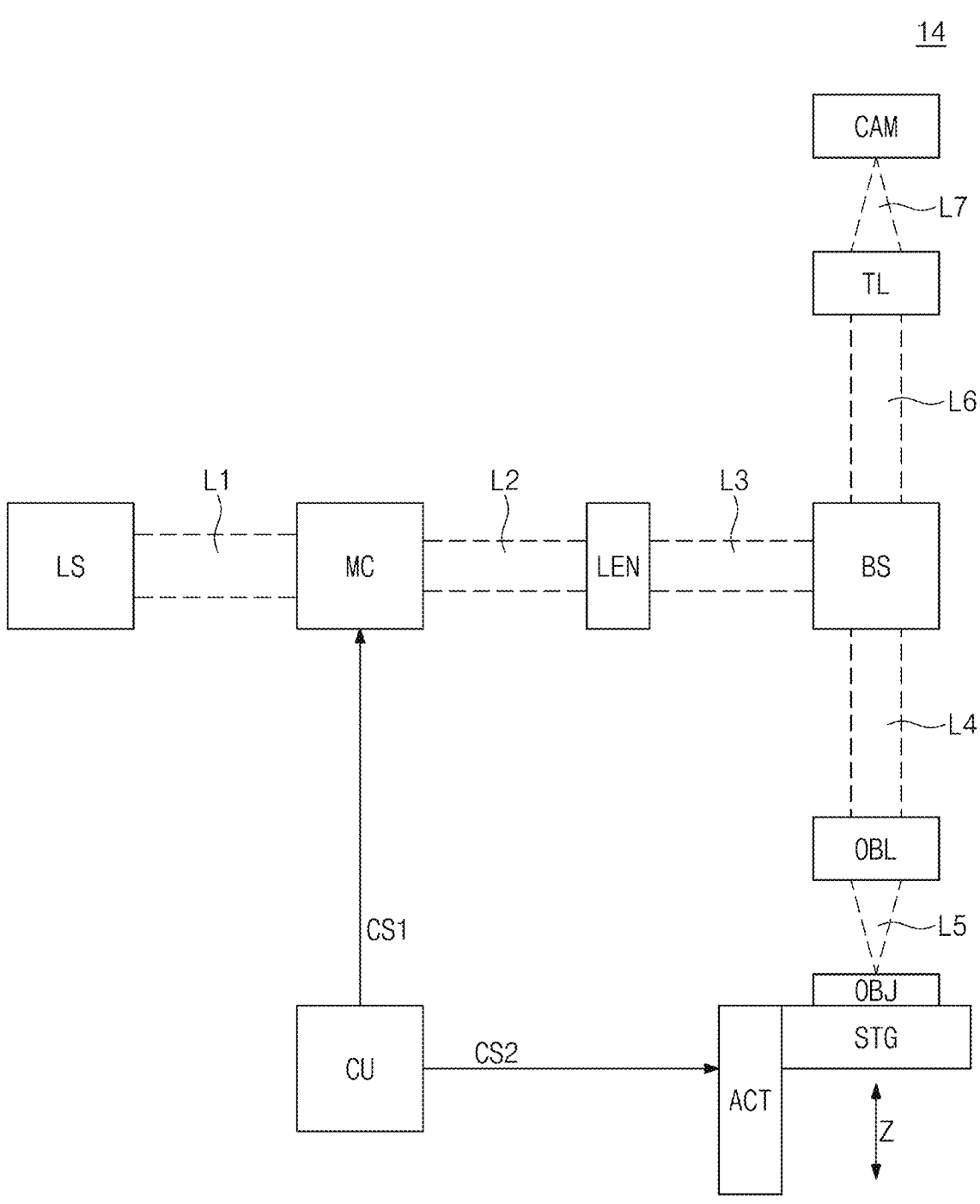
FIG. 3 illustrates an imaging device according to an embodiment of the present disclosure.

FIG. 3 illustrates the imaging device 14 according to an embodiment of the present disclosure. In an embodiment, the imaging device 14 may be a spectral TSOM device. Referring to FIGS. 1, 2, and 3, the imaging device 14 may include a light source LS, a monochromater MC, a lens LEN, a beam splitter BS, an object lens OBL, a stage STG, an actuator ACT, a tube lens TL, a camera CAM, and a controller CU.

The light source LS may output a first light L1. The first light L1 may be a broadband white light (e.g., light including wavelength ranges corresponding to the visible spectrum). For example, the light source LS may include at least one of various light sources such as an LED light source, a halogen light source, a xenon light source, and a laser light source.

The monochromater MC may convert the first light L1 into a second light L2. For example, the monochromater MC may output the second light L2 with a wavelength selected from various wavelengths which the first light L1 has (or may output the second light L2 with a narrowband wavelength range in which the selected wavelength is centered).

In an embodiment, the monochromater MC may select the wavelength (or center wavelength) of the second light L2 in response to a first control signal CS1 provided from the controller CU. The monochromater MC may adjust (or vary) the wavelength (or center wavelength) of the second light L2 under control of the controller CU.

The lens LEN may focus the second light L2 so as to be output as a third light L3. For example, the lens LEN may focus the second light L2 such that the third light L3 is incident onto the beam splitter BS at an appropriate angle and with an appropriate range.

The beam splitter BS may reflect the third light L3 or at least a portion of the third light L3 so as to be output toward the object lens OBL as a fourth light L4.

The object lens OBL may focus the fourth light L4 so as to be output as a fifth light L5. For example, the object lens OBL may focus the fourth light L4 such that the fifth light L5 is incident onto an object OBJ on the stage STG at an appropriate angle and with an appropriate range. In an embodiment, the object lens OBL may be configured to output the fifth light L5 with a fixed focus. As another example, the object lens OBL may be configured to be coupled to a device (e.g., an actuator) configured to adjust a depth or a location (e.g., a location on a plane parallel to the depth) of the focus of the object lens OBL under control of the controller CU.

The stage STG may be configured to hold the object OBJ. For example, the object OBJ may be the wafer WAF (refer to FIG. 2). The stage STG may be coupled to the actuator ACT. The actuator ACT may be configured to adjust a height "Z" of the stage STG in response to a second control signal CS2 provided from the controller CU. In an embodiment, the actuator ACT may be further configured to adjust a location on a plane parallel to the height "Z" of the stage STG in response to the second control signal CS2.

The fifth light L5 incident onto the object OBJ may be reflected from the object OBJ. For example, a reflection light reflected from the object OBJ may include a light reflected from the surface of the object OBJ and a light reflected from internal constituent materials of the object OBJ after being incident onto the object OBJ.

The reflection light reflected from the object OBJ may be incident onto the beam splitter BS through the object lens OBL. The beam splitter BS may be configured to pass the reflection light or at least a portion of the reflection light as a sixth light L6. The sixth light L6 may be incident onto the tube lens TL.

The tube lens TL may focus the sixth light L6 so as to be output as a seventh light L7. For example, the tube lens TL may focus the sixth light L6 such that the seventh light L7 is incident onto a lens of the camera CAM at an appropriate angle and with an appropriate range.

The camera CAM may capture the seventh light L7 to generate an image. For example, the camera CAM may generate a two-dimensional image. As used herein, an n-dimensional image may refer to images including n parameters of data, where n is an integer greater than or equal to 1.

The imaging device 14 according to an embodiment of the present disclosure may generate images based on a spectrum selecting a wavelength passing through the monochromater MC and the TSOM capturing images at points in time passing through the focus of the object lens OBL. The images generated by the imaging device 14 according to an embodiment of the present disclosure may support detecting weak areas of semiconductor dies statistically.

Figure 4:
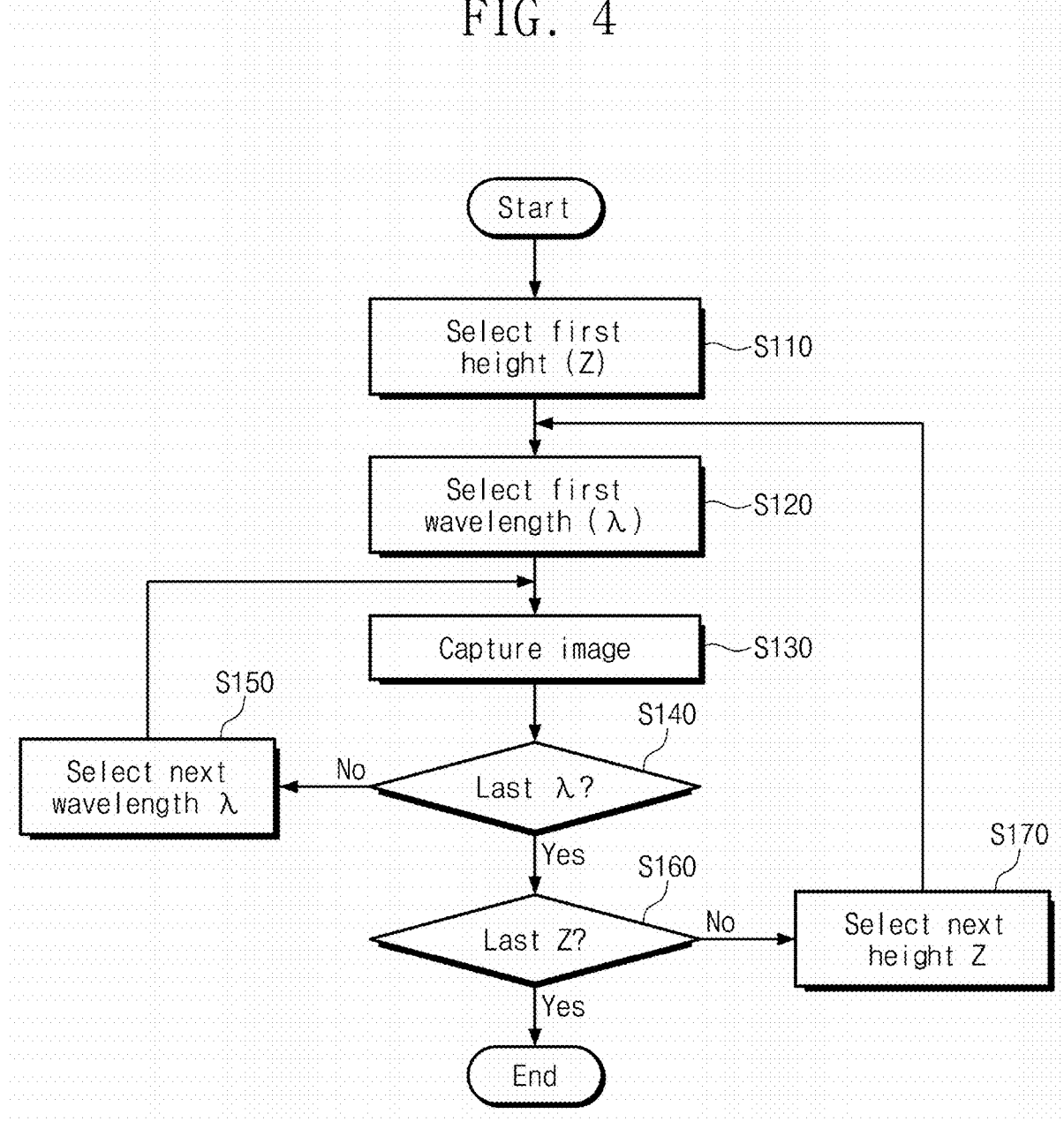
FIG. 4 illustrates an operating method of an imaging device according to an embodiment of the present disclosure.

FIG. 4 illustrates an operating method of the imaging device 14 according to an embodiment of the present disclosure. Referring to FIGS. 2, 3, and 4, in operation S110, the imaging device 14 may select a first height "Z". For example, the imaging device 14 may select the first height "Z" among heights of the stage STG selectable by using the actuator ACT. When the first height "Z" is selected, the actuator ACT may locate the stage STG at the selected height.

In operation S120, the imaging device 14 may select a first wavelength λ. For example, the imaging device 14 may select the first wavelength λ among wavelengths selectable by the monochromater MC. When the first wavelength λ is selected, the monochromater MC may pass light of the selected wavelength λ from among the first light L1, in some embodiments including light of a narrowband wavelength range in which the selected wavelength λ is centered, as the second light L2. That is, the second light L2 may refer to the light of the selected wavelength λ as well as light of a narrowband wavelength range that includes the light of the selected wavelength λ.

In operation S130, the imaging device 14 may capture an image. For example, the camera CAM of the imaging device 14 may capture a light reflected from the object OBJ as a two-dimensional image.

In operation S140, the imaging device 14 may determine whether the selected wavelength λ is the last wavelength λ for the analysis. For example, the controller CU may determine whether the last wavelength λ among the wavelengths selectable by the monochromater MC is selected.

When the last wavelength λ is not selected, in operation S150, the imaging device 14 may select a next wavelength λ. Afterwards, the imaging device 14 may perform operation S130. For example, until the last wavelength λ is selected, the imaging device 14 may repeat operation S150, operation S130, and operation S140 while sequentially selecting next wavelengths. That is, images which correspond to the selected height "Z" and correspond to different wavelengths may be captured by the camera CAM.

When the last wavelength λ is selected, in operation S160, the imaging device 14 may determine whether the last height "Z" for the analysis is selected. For example, the controller CU may determine whether the last height "Z" among the heights of the stage STG selectable by the actuator ACT is selected.

When the last height "Z" is not selected, in operation S170, the imaging device 14 may select a next height "Z". Afterwards, the imaging device 14 may perform operation S120. For example, the imaging device 14 may capture images corresponding to different wavelengths at the selected next height "Z" by performing operation S120, operation S130, operation S140, and operation S150.

The imaging device 14 may capture images at different heights by performing operation S120, operation S130, operation S140, operation S150, operation S160, and operation S170; in this case, the imaging device 14 may capture images corresponding to different wavelengths at each height.

When the last height is selected, the imaging device 14 may end the process.

In an embodiment, the imaging device 14 may perform the operation of FIG. 4 for each of semiconductor dies implemented in the wafer WAF. For example, the actuator ACT of the imaging device 14 may sequentially select semiconductor dies on the wafer WAF as an image capture target by moving the stage STG on the plane parallel to a height (Z) direction of the stage STG (e.g., on the plane in which the height (Z) direction corresponds to the normal).

In an embodiment, the imaging device 14 may capture images of two or more semiconductor dies in parallel by using two or more different object lenses, different beam splitters, different tube lenses, and different cameras.

In an embodiment, the imaging device 14 may manage the images of the first semiconductor dies D1 by separately storing or tagging the images as images of normal semiconductor dies.

Figure 5:
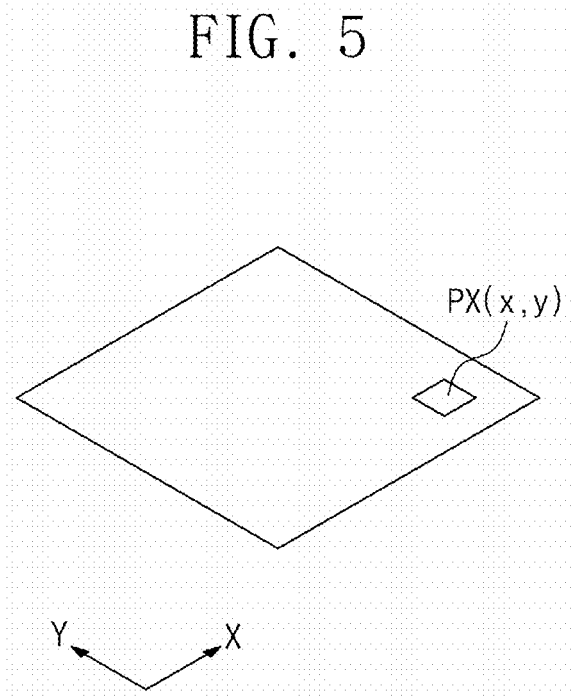
FIG. 5 illustrates an example of an image captured based on a selected height and a selected wavelength.

FIG. 5 illustrates an example of an image captured based on the selected height "Z" and the selected wavelength λ. Referring to FIGS. 3 and 5, an image may be in the shape of a plane based on an X-axis and a Y-axis. The X-axis and the Y-axis may define a plane on which an image is captured by the camera CAM. The X-axis and the Y-axis may define a plane of pixels of an image sensor included in the camera CAM. The plane based on the X-axis and the Y-axis may be a plane perpendicular to the height "Z" of the stage STG, for example, a plane in which the height (Z) direction corresponds to the normal.

The image may include a plurality of pixels. In an embodiment, a pixel PX(x, y) of an arbitrary location is illustrated in FIG. 5. The pixel PX(x, y) may have values each indicating the brightness of a color depending on a kind of the image sensor of the camera CAM. For example, when the image sensor of the camera CAM includes an RGB sensor, the pixel PX(x, y) may have a value corresponding to the brightness of a red color, a value corresponding to the brightness of a green color, and a value corresponding to the brightness of a blue color.

As another example, when the image sensor of the camera CAM includes a mono sensor, the pixel PX(x, y) may have one value corresponding to the brightness. When the pixel PX(x, y) has one value corresponding to the brightness, the image may be expressed in the form of a heatmap.

In an embodiment, the values of the pixels of the image may be normalized. For example, the values of the pixels of the image may be normalized by using values of pixels of a bare image captured from a bare wafer WAF, in which semiconductor patterns are not formed, based on the selected height "Z" and the selected wavelength λ. For example, the values of the pixels of the image may be normalized to values corresponding to a ratio to the values of the pixels of the bare image. In an embodiment, the normalization may be performed by the controller CU or may be performed by the external verification module 16 (refer to FIG. 1).

Figure 6A:
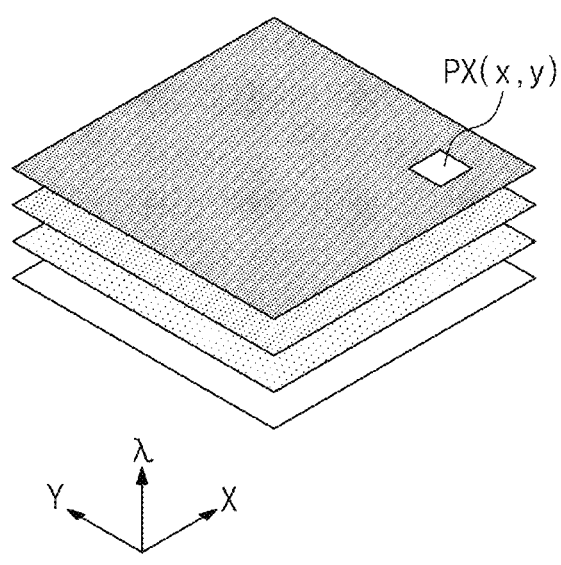
FIG. 6A illustrates an example of images captured based on different wavelengths at a selected height.

FIG. 6A illustrates an example of images captured based on different wavelengths at the selected height "Z". In FIG. 6A, the vertical axis may correspond to the wavelength λ selected by the monochromater MC. As illustrated in FIG. 6A, at the selected height "Z", the imaging device 14 may capture images corresponding to different wavelengths.

The images corresponding to the different wavelengths may be normalized by using bare images corresponding to the different wavelengths. The normalization may be performed by the controller CU or the external verification module 16.

Figure 6B:
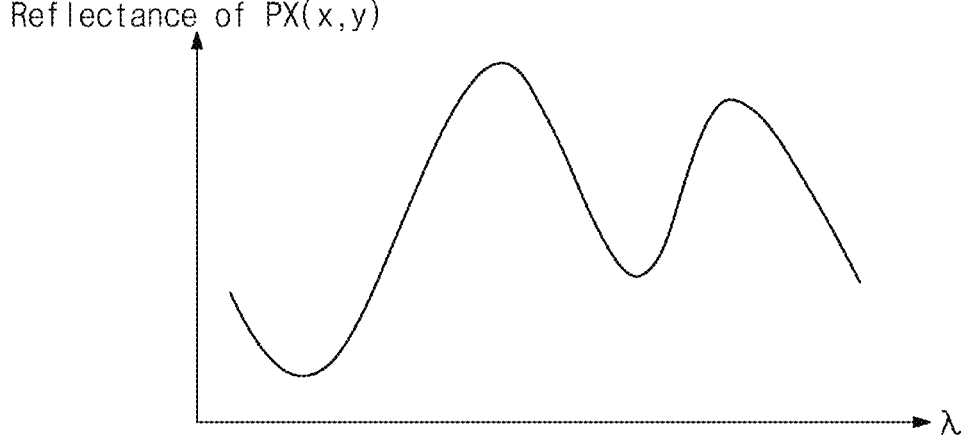
FIG. 6B illustrates an example of a change in normalized values according to a wavelength of a pixel.

FIG. 6B illustrates an example of a change in normalized values according to the wavelength λ of the pixel PX(x, y). In an embodiment, the normalized value of the pixel PX(x, y) may be regarded as reflectance. That is, FIG. 6B shows the reflectance according to the wavelength λ of the pixel PX(x, y).

Referring to FIG. 6B, the pixel PX (x, y) may have reflectance which varies depending on a wavelength. The normalized images may provide information of reflectance, which varies depending on a wavelength, for each pixel, and thus, the imaging device 14 may obtain spectral information about the object OBJ.

In an embodiment, the normalized images of FIG. 6A may include three-dimensional information and thus may be called an image cube. The imaging device 14 may adjust the height "Z" of the stage STG to obtain image cubes. Different image cubes may include information corresponding to different heights of the stage STG, that is, the height of the object OBJ. That is, the imaging device 14 may obtain through-focus scanning optical microscope (TSOM) information about the object OBJ.

Different image cubes may include TSOM information, and each image cube may include spectral information. That is, the imaging device 14 may be a spectral TSOM device which obtains spectral TSOM information.

Figure 7:
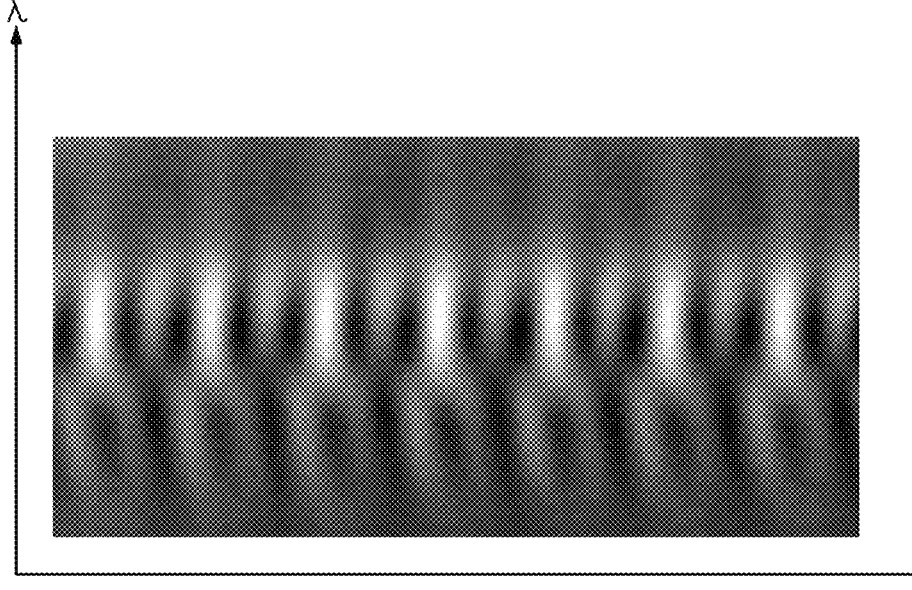
FIG. 7 illustrates an example of spectral TSOM information of a pixel.

FIG. 7 illustrates an example of spectral TSOM information of the pixel PX(x, y). Referring to FIGS. 2, 3, and 7, each image cube may provide information about the wavelength $\lambda$ in association with the pixel PX(x, y), and different image cubes may provide information about the height "Z". A value of an arbitrary location on the plane of FIG. 7 may be the reflectance of the pixel PX(x, y) corresponding to the wavelength $\lambda$ and the height "Z". Each of the pixels of the image may have information of the plane defined by the wavelength $\lambda$ and the height "Z."

The image cubes obtained by the imaging device 14 may be a four-dimensional image defined by four parameters, namely, along the X-axis, the Y-axis, the $\lambda$-axis, and the Z-axis. The imaging device 14 may obtain different four-dimensional images from different semiconductor dies on the wafer WAF.

When the operations of FIG. 4 are performed by the imaging device 14, there may be obtained a plurality of four-dimensional images (e.g., normalized or not normalized), which respectively correspond to a plurality of semiconductor dies on the wafer WAF.

Figure 8:
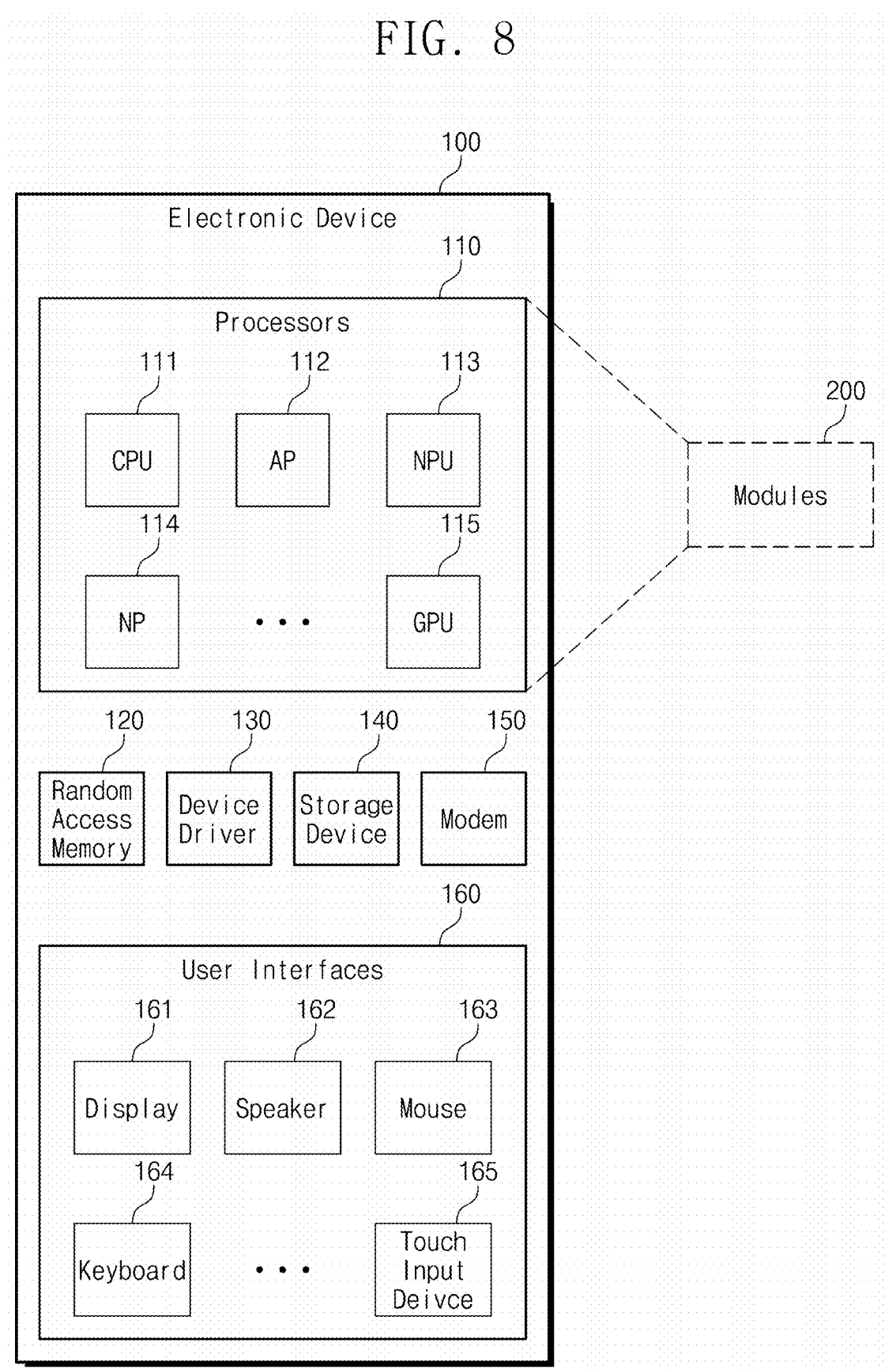
FIG. 8 is a block diagram illustrating an electronic device according to an embodiment of the present disclosure.

FIG. 8 is a block diagram illustrating an electronic device 100 according to an embodiment of the present disclosure. Referring to FIGS. 1 and 8, the electronic device 100 may include processors 110, a random access memory 120, a device driver 130, a storage device 140, a modem 150, and user interfaces 160.

The processors 110 may include, for example, at least one general-purpose processor such as a central processing unit (CPU) 111 or an application processor (AP) 112. Also, the processors 110 may further include at least one special-purpose processor such as a neural processing unit (NPU) 113, a neuromorphic processor (NP) 114, or a graphics processing unit (GPU) 115. The processor 110 may include two or more homogeneous processors. The random access memory 120 may be used as a working memory of the processors 110 and may be used as a main memory or a system memory of the electronic device 100. The random access memory 120 may include a volatile memory such as a dynamic random access memory or a static random access memory, or a nonvolatile memory such as a phase-change random access memory, a ferroelectric random access memory, a magnetic random access memory, or a resistive random access memory.

The device driver 130 may control the following peripheral devices depending on a request of the processors 110: the storage device 140, the modem 150, and the user interfaces 160. The storage device 140 may include a stationary storage device such as a hard disk drive or a solid state drive, or a removable storage device such as an external hard disk drive, an external solid state drive, or a removable memory card.

The modem 150 may provide remote communication with the external device. The modem 150 may perform wired or wireless communication with the external device. The modem 150 may communicate with the external device based on at least one of various communication schemes such as Ethernet, wireless-fidelity (Wi-Fi), long term evolution (LTE), and 5th generation (5G) mobile communication.

The user interfaces 160 may receive information from the user and may provide information to the user. The user interfaces 160 may include at least one user output interface such as a display 161 or a speaker 162, and at least one user input interface such as a mouse 163, a keyboard 164, or a touch input device 165.

The processors 110 may execute modules 200, which may include computer program instructions stored in a non-transitory computer readable storage medium. The modules 200 may include the verification module 16. The modules 200 may further include at least one of the layout generation module 11 and the modification module 12. The layout generation module 11, the modification module 12, and the verification module 16 may be implemented or executed in different electronic devices. At least two of the layout generation module 11, the modification module 12, and the verification module 16 may be implemented or executed in one electronic device.

The instructions (or codes) of the module(s) 200 may be received through the modem 150 and may be stored in the storage device 140. The instructions (or codes) of the module(s) 200 may be stored in a removable storage device, and the removable storage device may be connected to the electronic device 100. The instructions (or codes) of the module(s) 200 may be loaded to the random access memory 120 from the storage device 140 so as to be executed thereon.

Figure 9:
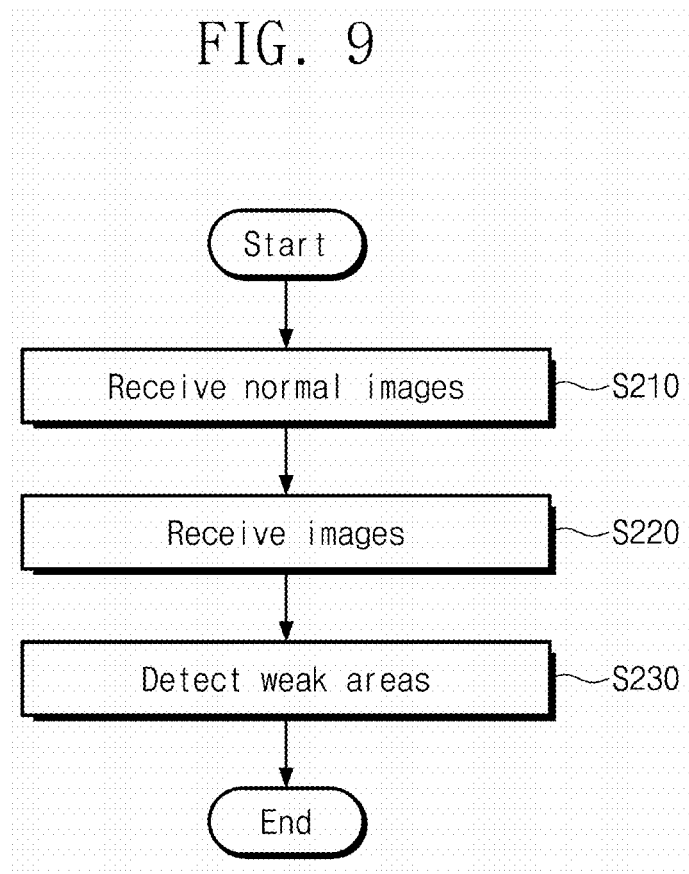
FIG. 9 illustrates an operating method of an electronic device according to an embodiment of the present disclosure.

FIG. 9 illustrates an operating method of the electronic device 100 according to an embodiment of the present disclosure. Referring to FIGS. 1, 2, and 9, in operation S210, the electronic device 100 may receive normal images, also referred to herein as reference images. For example, the processors 110 of the electronic device 100 may receive images of the first semiconductor dies D1 positioned in the central area of the wafer WAF from the database 15. For example, the electronic device 100 may remotely communicate with the database 15 through the modem 150. As another example, the database 15 may be implemented as local storage of the electronic device 100, such as the storage device 140.

In operation S220, the electronic device 100 may receive images to be analyzed. For example, the processors 110 of the electronic device 100 may receive images of the second semiconductor dies D2 surrounding the first semiconductor dies D1 positioned in the central area of the wafer WAF from the database 15. In an embodiment, a boundary for distinguishing the first semiconductor dies D1 from the second semiconductor dies D2 may vary depending on a physical characteristic of the wafer WAF, a process characteristic, characteristics of materials to be used in the process, and/or a characteristic of the modified layout image MLO to be applied to the process. The boundary between the first semiconductor dies D1 and second semiconductor dies D2 may be determined in advance before images are captured by using the imaging device 14.

In operation S230, the electronic device 100 may detect weak areas. For example, the processors 110 of the electronic device 100 may detect weak areas regarded as having a defect, by statistically analyzing and comparing four-dimensional images of the first semiconductor dies D1 regarded as normal and four-dimensional images of semiconductor dies including the first semiconductor dies D1 and the second semiconductor dies D2.

As described above, the electronic device 100 according to an embodiment of the present disclosure may detect a weak area on the entire wafer WAF based on images of all the semiconductor dies, rather than based on the measurement of a limited area such as an optical critical dimension (OCD) measurement. Also, the electronic device 100 according to an embodiment of the present disclosure may detect weak areas based on the statistical analysis and comparison of four-dimensional images without performing semiconductor modeling. Accordingly, the semiconductor manufacturing system 10 capable of detecting defect areas quickly with high reliability is provided.

Figure 10:
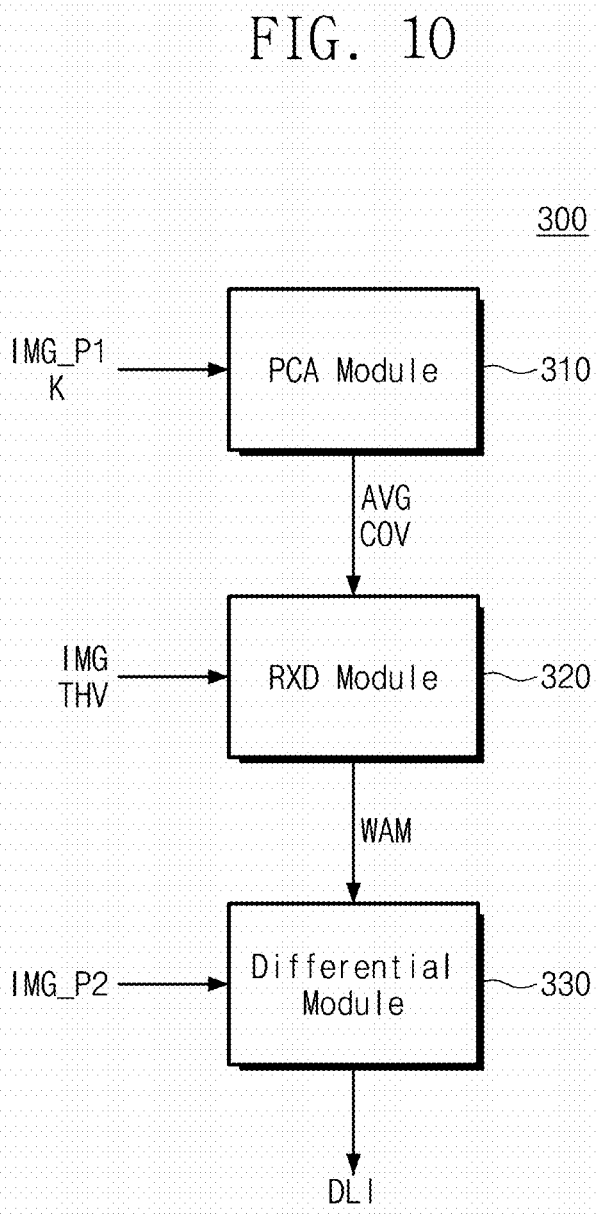
FIG. 10 illustrates a verification module according to an embodiment of the present disclosure.

FIG. 10 illustrates a verification module 300 according to an embodiment of the present disclosure. In an embodiment, the verification module 300 may correspond to the verification module 16 of FIG. 1. Referring to FIGS. 1, 2, 8, and 10, the verification module 300 may include a principle component analysis (PCA) module 310, a read-xiaoli detection (RXD) module 320, and a differential module 330.

The PCA module 310 may receive first partial images IMG_P1 from the database 15. The first partial images IMG_P1 may include four-dimensional images of the first semiconductor dies D1 regarded as normal or reference semiconductor dies.

The PCA module 310 may further receive a variable "K". In an embodiment, the variable "K" may be determined by the user controlling the electronic device 100 or may be determined by the electronic device 100 based on features of four-dimensional images of semiconductor dies on the wafer WAF. For example, a module determining a value of the variable "K" may be included as one of the modules 200.

The PCA module 310 may calculate an average AVG and a covariance COV corresponding to reflex ratios according to the height "Z" and the wavelength λ of the first semiconductor dies D1, based on the first partial images IMG_P1 and the variable "K".

The RXD module 320 may receive the average AVG and the covariance COV from the PCA module 310. The RXD module 320 may receive the image IMG from the database 15. The image IMG may include four-dimensional images of the first semiconductor dies D1 and the second semiconductor dies D2 of the wafer WAF.

The RXD module 320 may further receive a threshold value THV. The threshold value THV may be determined by the user controlling the electronic device 100 or may be determined by the electronic device 100 based on features of four-dimensional images of semiconductor dies on the wafer WAF. For example, a module determining a value of the threshold value THV may be included as one of the modules 200.

The RXD module 320 may generate a weak area map WAM, based on the average AVG, the covariance COV, the images IMG, and the threshold value THV. The weak area map WAM may indicate weak areas regarded as having a defect in each semiconductor die. The weak area map WAM may indicate the weak areas on the plane of the X-axis and the Y-axis.

The differential module 330 may receive the weak area map WAM from the RXD module 320. The differential module 330 may receive second partial images IMG_P2 from the database 15. The second partial images IMG_P2 may include a weak image which is two-dimensional defined by the λ-axis and the Z-axis and corresponds to the weak area. The second partial images IMG_P2 may include a normal image which is two-dimensional defined by the λ-axis and the Z-axis and corresponds to the weak area. The differential module 330 may detect a weak area on the Z-axis, based on the two-dimensional normal image and the two-dimensional weak image. The differential module 330 may output defect location information DLI indicating the weak area on the Z-axis thus detected.

In an embodiment, when the first partial images IMG_P1, the images IMG, or the second partial images IMG_P2 received from the database 15 are not normalized, the verification module 16 may further include a normalization module. The normalization module may normalize brightness values according to the λ-axis and the Z-axis on the X-axis and the Y-axis reflected from the object OBJ, by using brightness values according to the λ-axis and the Z-axis on the X-axis and the Y-axis reflected from the bare wafer. For example, the normalization module may normalize the first partial images IMG_P1, the images IMG, or the second partial images IMG_P2 by dividing the brightness values according to the λ-axis and the Z-axis on the X-axis and the Y-axis reflected from the object OBJ by the brightness values according to the λ-axis and the Z-axis on the X-axis and the Y-axis reflected from the object OBJ and multiplying a division result and a normalization factor (e.g., an arbitrary constant) together.

Figure 11:
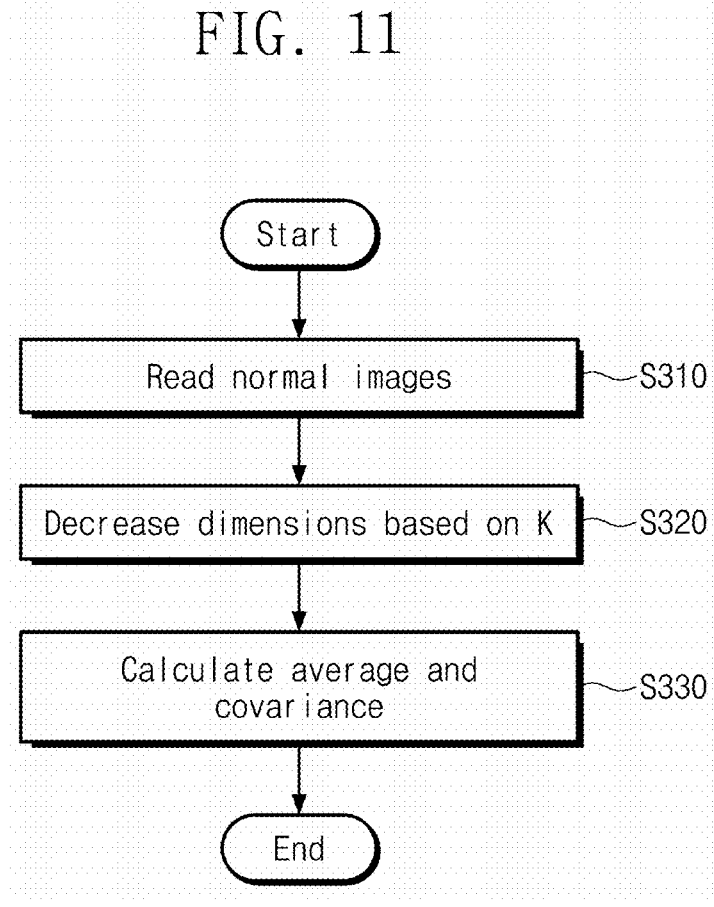
FIG. 11 illustrates an example of an operating method of a PCA module.

FIG. 11 is a diagram illustrating an example of an operating method of the PCA module 310. Referring to FIGS. 1, 2, 10, and 11, the PCA module 310 may read normal images in operation S310. For example, the PCA module 310 may read the normalized images of the first semiconductor dies D1.

In operation S320, the PCA module 310 may reduce dimensions of the images based on the variable "K". For example, an image of each semiconductor die may be a four-dimensional image including the X-axis, the Y-axis, the λ-axis, and the Z-axis. The variable "K" may be a positive integer less than 4. The PCA module 310 may reduce the dimensions or parameters of the respective semiconductor dies to a value of the variable "K" by performing the PCA. The image of the reduced dimension of each semiconductor die may have reduced information.

In operation S330, the PCA module 310 may calculate the average AVG and the covariance COV. For example, the PCA module 310 may calculate the average AVG and the covariance COV in the reduced dimensions of the semiconductor dies. For example, the PCA module 310 may calculate the average AVG and the covariance COV corresponding to the normal distribution under the assumption that the images of the reduced dimensions correspond to the normal distribution. Because the image of the reduced dimension has reduced information, the amount of computation necessary to calculate the average AVG and the covariance COV may decrease.

The average AVG and the covariance COV calculated by the PCA module 310 may be transferred to the RXD module 320. In an embodiment, the average AVG and the covariance COV calculated from the first semiconductor dies D1 regarded as normal or reference images may be regarded as an average and a covariance of normal or reference semiconductor dies.

Figure 12:
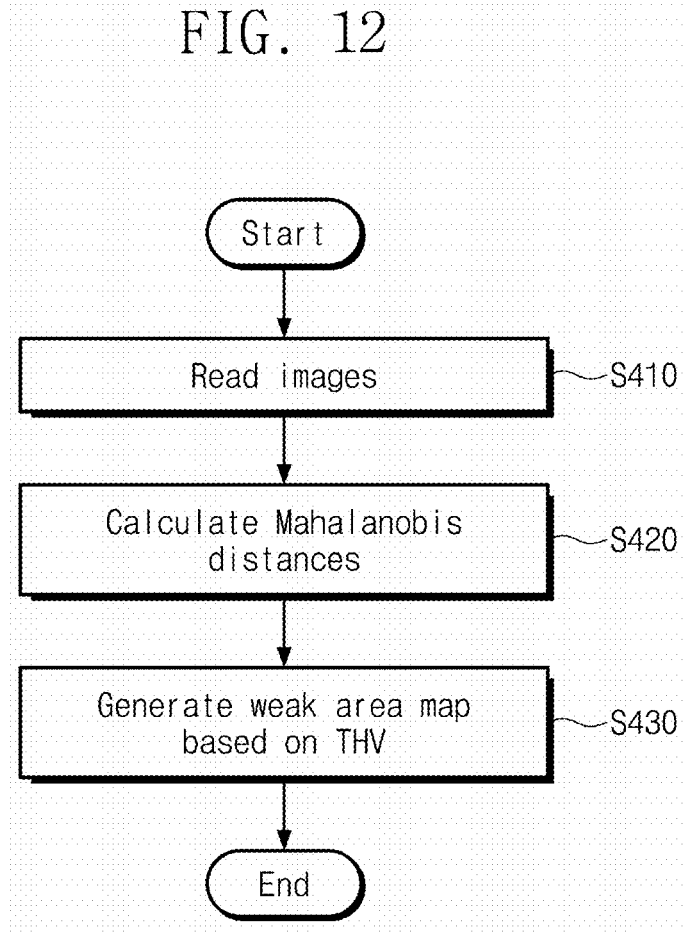
FIG. 12 is a diagram illustrating an example of an operating method of an RXD module.

FIG. 12 is a diagram illustrating an example of an operating method of the RXD module 320. Referring to FIGS. 1, 2, and 12, in operation S410, the RXD module 320 may receive images. For example, the RXD module 320 may read the normalized images of the first semiconductor dies D1 and the normalized images of the second semiconductor dies D2.

In operation S420, the RXD module 320 may calculate a Mahalanobis distance between an image on the λ-axis and the Z-axis corresponding to a pixel of each of normalized images of semiconductor dies and the average AVG and the covariance COV. The RXD module 320 may calculate the Mahalanobis distance of each pixel on the X-axis and the Y-axis of images of semiconductor dies.

In operation S430, the RXD module 320 may detect weak areas. For example, the RXD module 320 may detect pixels each having the Mahalanobis distance greater than the threshold value THV as weak areas on the X-axis and Y-axis. The RXD module 320 may generate the weak area map WAM based on the detected weak areas.

In an embodiment, because one semiconductor die corresponds to one image of the X-axis and the Y-axis, the weak area map WAM may be similar to the shape of the first semiconductor dies D1 and the second semiconductor dies D2 of FIG. 2. The weak area map WAM may indicate pixels on the X-axis and the Y-axis corresponding to a weak area in the shape of the first semiconductor dies D1 and the second semiconductor dies D2 of FIG. 2.

Figure 13:
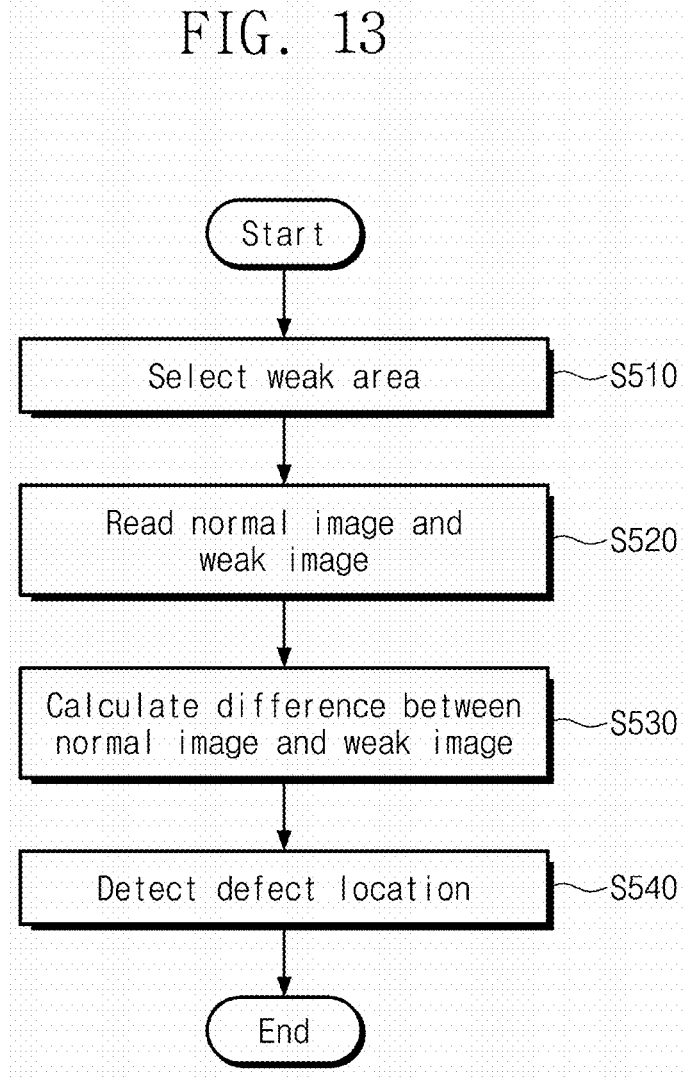
FIG. 13 illustrates an example of an operating method of a differential module.

FIG. 13 illustrates an example of an operating method of the differential module 330. Referring to FIGS. 1, 2, 10, and 13, in operation S510, the differential module 330 may select a weak area. For example, the differential module 330 may select an image on the X-axis and the Y-axis corresponding to one die including a weak area. The differential module 330 may select one pixel on the X-axis and the Y-axis corresponding to the weak area, in the selected image.

In operation S520, the differential module 330 may read a normal image and a weak image. For example, one semiconductor die among the first semiconductor dies D1 may be selected as a reference semiconductor die. For example, a semiconductor die the closest to the center of the wafer WAF may be selected as the reference semiconductor die.

The differential module 330 may read a two-dimensional image of the λ-axis and the Z-axis corresponding to the selected pixel on the X-axis and the Y-axis as the normal image, in an image of the reference semiconductor die. The differential module 330 may read a two-dimensional image of the λ-axis and the Z-axis corresponding to the selected pixel on the X-axis and the Y-axis as the weak image, in the image having the weak area.

In operation S530, the differential module 330 may calculate a difference between the normal image and the weak image. For example, the differential module 330 may calculate a difference between a brightness value of each point on the λ-axis and the Z-axis of the two-dimensional normal image of the λ-axis and the Z-axis and a brightness value of each point on the λ-axis and the Z-axis of the two-dimensional weak image of the λ-axis and the Z-axis. The calculated difference may be an image of two-dimensional brightness difference values of the λ-axis and the Z-axis.

In an embodiment, points having great values on the image of the difference values (e.g., points having a value greater than an arbitrary threshold value) may be points at which a difference between the two-dimensional normal image of the λ-axis and the Z-axis and the two-dimensional weak image of the λ-axis and the Z-axis is great. The differential module 330 may detect the points, at which the difference between the two-dimensional normal image of the λ-axis and the Z-axis and the two-dimensional weak image of the λ-axis and the Z-axis is great (relative to the threshold value) as weak areas on the Z-axis.

In an embodiment, a value of the Z-axis may be a value of the height of the stage STG. Accordingly, the value of the Z-axis may be replaced with a value of the height of the object OBJ. That is, in operation S540, the differential module 330 may detect the defect locations or weak areas on the Z-axis of the object OBJ, based on spectral TSOM images of the object OBJ.

In an embodiment, the method of FIG. 13 may be performed for each of weak areas of a selected semiconductor die. Alternatively, the method of FIG. 13 may be performed for sampled weak areas among multiple weak areas of a selected semiconductor die. For example, some weak areas having a relatively great difference (e.g., being greater than an arbitrary threshold value) from among the multiple weak areas of the selected semiconductor die may be sampled.

In an embodiment, assuming that semiconductor dies having weak areas are sequentially selected, the method of FIG. 13 may be performed for each of the weak areas of each of the sequentially selected semiconductor dies. Alternatively, the method of FIG. 13 may be performed for some (e.g. a subset of) sampled semiconductor dies among semiconductor dies having weak areas. For example, semiconductor dies having a relatively large number of weak areas (e.g., semiconductor dies having weak areas, the number of which is more than an arbitrary threshold value) may be sampled.

As described above, the semiconductor manufacturing system 10 according to an embodiment of the present disclosure may detect a weak area on the X-axis, the Y-axis, and the Z-axis statistically based on spectral TSOM images, in all the semiconductor dies on the wafer WAF, without semiconductor modeling. Accordingly, the amount of computation necessary for the semiconductor manufacturing system 10 to detect weak areas of semiconductor dies may decrease, and a speed at which the semiconductor manufacturing system 10 detects the weak areas may be improved.

Figure 14:
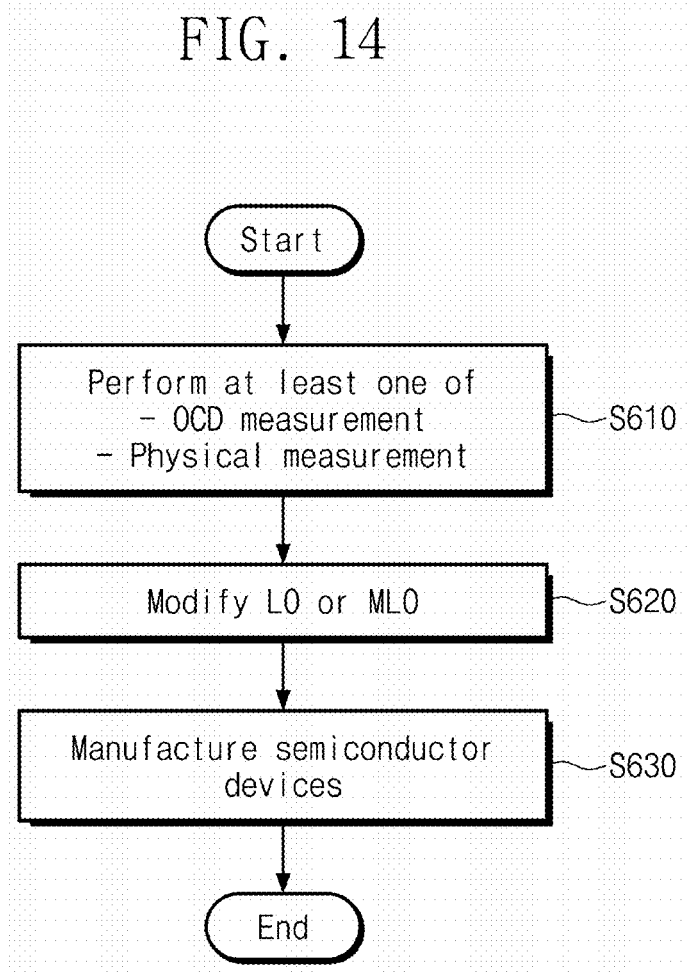
FIG. 14 illustrates an example of a subsequent operation of a semiconductor manufacturing system according to an embodiment of the present disclosure.

FIG. 14 illustrates an example of a subsequent operation of the semiconductor manufacturing system 10 according to an embodiment of the present disclosure. Referring to FIGS. 1, 2, and 14, in operation S610, the semiconductor manufacturing system 10 may perform at least one of OCD measurement and physical measurement. For example, the semiconductor manufacturing system 10 may perform the OCD measurement on a weak area of a semiconductor die by using the imaging device 14. Alternatively, the semiconductor manufacturing system 10 may perform the physical measurement by sectioning a weak area of a semiconductor die and inspecting the weak area by using the imaging device 14.

In operation S620, the semiconductor manufacturing system 10 may modify the layout image LO or the modified layout image MLO. The semiconductor manufacturing system 10 may analyze or infer a cause of a defect based on an OCD measurement result or a physical measurement result of the weak area. The semiconductor manufacturing system 10 may modify the layout image LO or the modified layout image MLO such that the defect is compensated for, is suppressed, or is removed.

In operation S630, the semiconductor manufacturing system 10 may manufacture semiconductor devices. For example, the semiconductor manufacturing system 10 may manufacture semiconductor devices by applying the processes PRC to the wafer WAF based on a result of modifying the layout image LO or the modified layout image MLO.

In the above embodiments, components according to the present disclosure are described by using the terms "first," "second," "third," etc. However, the terms "first," "second," "third," etc. may be used to distinguish components from each other and do not limit the present disclosure. For example, the terms "first," "second," "third," etc. do not involve an order or a numerical meaning of any form. The terms "comprises," "comprising," "includes" and/or "including," when used herein, specify the presence of stated elements, but do not preclude the presence of additional elements. The term "and/or" includes any and all combinations of one or more of the associated listed items.

In the above embodiments, components according to embodiments of the present disclosure are illustrated with reference to modules or blocks. The modules or blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit.

The figures herein illustrate the architecture, functionality, and operations of embodiments of hardware and/or software according to various embodiments of the present invention. It will be understood that each block of a block diagram illustration, and combinations of blocks in the block diagram illustrations, may be implemented by computer program instructions and/or hardware operations. In this regard, each block represents a module, segment, or portion of code, which comprises one or more executable instructions for implementing the specified logical function(s). It should be noted that, in other implementations, the function(s) noted in or associated with the blocks may occur out of the order noted in the figures.

The computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the block diagram block or blocks. The computer program instructions may also be stored in a non-transitory computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

According to embodiments of the present disclosure, a defect or weak area of a semiconductor device is detected based on images corresponding to a height of the semiconductor device and a wavelength of a light emitted to the semiconductor device, without modeling of the semiconductor device. Accordingly, detection of defects of a semiconductor device may be improved or performed more easily.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of operating an electronic device that is configured to support manufacturing a semiconductor device, the method comprising:
 selecting a height of a stage of the electronic device using an actuator of the electronic device, wherein the stage is configured to hold the semiconductor device;
 generating a white light of a first wavelength range using a light source of the electronic device;
 generating light of a selected wavelength within the first wavelength range by filtering the white light using a monochromater of the electronic device;
 emitting the light of the selected wavelength to the semiconductor device using a beam splitter of the electronic device;
 capturing reflection light reflected from the semiconductor device using a camera of the electronic device;
 adjusting the selected wavelength and repeating, at the electronic device, the generating of the light of the selected wavelength, the emitting, and the capturing responsive to the adjusting of the selected wavelength; and
 adjusting the height of the stage and repeating, at the electronic device, the generating of the white light, the generating of the light of the selected wavelength, the emitting, the capturing, and the repeating responsive to the adjusting of the height of the stage.

2. The method of claim 1, wherein the semiconductor device is one of a plurality of semiconductor dies of a wafer.

3. The method of claim 2, further comprising:
 selecting a next one of the plurality of semiconductor dies; and
 repeating the selecting, the generating of the white light, the generating of the light of the selected wavelength, the emitting, the capturing, the repeating while adjusting the selected wavelength, and the repeating while adjusting the height of the stage, responsive to the selecting of the next one of the plurality of semiconductor dies.

4. The method of claim 3, wherein the plurality of semiconductor dies include first dies at a central region of the wafer and second dies at a peripheral region of the wafer, and
 wherein the method further comprises:
 storing images captured from the first dies as reference images for defect verification.

5. The method of claim 4, further comprising:
 storing the images captured from the first dies and images captured from the second dies as the reference images for defect verification.

6. The method of claim 1, wherein images captured from the semiconductor device include a data indicating a height of the semiconductor device, the selected wavelength, and first and second two-dimensional coordinates of an image obtained from the semiconductor device.

7. A method of operating an electronic device that is configured to support manufacturing a plurality of semiconductor dies, the method comprising:
 receiving, at the electronic device, first images captured from reference semiconductor dies among the plurality of semiconductor dies;
 receiving, at the electronic device, second images captured from remaining semiconductor dies among the plurality of semiconductor dies; and
 detecting, at the electronic device, weak areas of at least one of the plurality of semiconductor dies based on the first images and the second images, wherein the second images include data indicating a height of the remaining semiconductor dies, a wavelength of light emitted to the remaining semiconductor dies, a column of pixels of each of the second images, and a row of the pixels.

8. The method of claim 7, wherein the detecting of the weak areas comprises:

detecting the weak areas at the height of the remaining semiconductor dies.

9. The method of claim 7, wherein the detecting of the weak areas comprises:

generating reference images having reduced data by performing a principal component analysis on the first images such that the data of the first images is reduced; and calculating an average and a covariance matrix of a normal distribution from the reference images having the reduced data.

10. The method of claim 9, wherein the detecting of the weak areas further includes:

calculating a Mahalanobis distance for each of the pixels of the second images based on the second images, the average, and the covariance matrix.

11. The method of claim 10, further comprising:

identifying a subset of the pixels in which the Mahalanobis distance is greater than a threshold value as comprising the weak areas.

12. The method of claim 7, wherein the detecting of the weak areas comprises:

indicating the weak areas with reference to the row of the pixels and the column of the pixels of the second images.

13. The method of claim 12, wherein the detecting of the weak areas comprises:

selecting a reference image among the first images; and calculating a differential image based on the height and the wavelength of an area of the reference image corresponding to the weak areas, and based on the height and the wavelength of an area of an image among the second images comprising the weak areas.

14. The method of claim 13, wherein the detecting of the weak areas further comprises:

detecting a height corresponding to a singular point on the differential image as a weak area of the row of the pixels, the column of the pixels, and the height.

15. The method of claim 7, wherein the reference semiconductor dies and the remaining semiconductor dies are included in a same wafer.

16. A method of operating a semiconductor manufacturing system which includes first and second electronic devices configured to support manufacturing a plurality of semiconductor dies on a wafer, the method comprising:

selecting a height of a stage of the first electronic device using an actuator of the first electronic device, wherein the stage is configured to hold the wafer;

generating white light of a first wavelength range using a light source of the first electronic device;

generating light of a selected wavelength within the first wavelength range by filtering the white light using a monochromater of the first electronic device;

emitting the light of the selected wavelength to the plurality of semiconductor dies using a beam splitter of the first electronic device;

capturing reflection light reflected from the plurality of semiconductor dies using a camera of the first electronic device;

adjusting the selected wavelength and repeating, at the first electronic device, the generating of the light of the selected wavelength, the emitting, and the capturing responsive to the adjusting of the selected wavelength;

adjusting the height of the stage and repeating, at the first electronic device, the generating of the white light, the generating of the light of the selected wavelength, the emitting, the capturing, and the adjusting of the selected wavelength responsive to the adjusting of the height of the stage;

selecting a next one of the plurality of semiconductor dies and repeating, at the first electronic device, the selecting the height of the stage, the generating of the white light, the generating of the light of the selected wavelength, the emitting, the capturing, the adjusting of the selected wavelength, and the adjusting of the height of the stage, responsive to the selecting of the next one of the plurality of semiconductor dies;

receiving, at the second electronic device, first images captured from reference semiconductor dies among the plurality of semiconductor dies;

receiving, at the second electronic device, second images captured from remaining semiconductor dies among the plurality of semiconductor dies; and detecting, at the second electronic device, weak areas of at least one of the plurality of semiconductor dies based on the first images and the second images, wherein the second images include data indicating a height of the remaining semiconductor dies a wavelength of the light emitted to the remaining semiconductor dies, a column of pixels of each of the second images, and a row of the pixels.

17. The method of claim 16, further comprising:

performing, at a third electronic device, optical critical dimension (OCD) measurement of the weak areas of the at least one of the plurality of semiconductor dies.

18. The method of claim 16, further comprising:

sectioning, at a third electronic device, the weak areas of the at least one of the plurality of semiconductor dies.

19. The method of claim 16, further comprising:

modifying, at a third electronic device, a layout image of the semiconductor dies, based on the weak areas of the at least one of the plurality of semiconductor dies.

20. The method of claim 19, further comprising:

manufacturing, at a fourth electronic device, a plurality of additional semiconductor dies on an additional wafer based on the layout image that was modified.

* * * * *